United States Patent
Zhang et al.

(10) Patent No.: US 8,064,244 B2
(45) Date of Patent: Nov. 22, 2011

(54) THIN SEEDED CO/NI MULTILAYER FILM WITH PERPENDICULAR ANISOTROPY FOR SPINTRONIC DEVICE APPLICATIONS

(75) Inventors: Kunliang Zhang, Fremont, CA (US); Min Li, Dublin, CA (US); Yuchen Zhou, San Jose, CA (US); Soichi Oikawa, Koyasu-machi (JP); Kenichiro Yamada, Tokyo (JP); Katsuhiko Koui, Kamagawa (JP)

(73) Assignees: TDK Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 350 days.

(21) Appl. No.: 12/456,621

(22) Filed: Jun. 19, 2009

(65) Prior Publication Data

US 2009/0257151 A1 Oct. 15, 2009

(51) Int. Cl. *G11C 11/00* (2006.01)
(52) U.S. Cl. ........ 365/158; 257/421; 365/171; 365/173; 428/811.1; 438/3
(58) Field of Classification Search .......... 257/421; 365/158, 171, 173; 428/811.1
See application file for complete search history.

(56) References Cited

U.S. PATENT DOCUMENTS

| | | | |
|---|---|---|---|
| 5,871,622 A * | 2/1999 | Pinarbasi | 204/192.11 |
| 6,023,395 A * | 2/2000 | Dill et al. | 360/324.2 |
| 7,105,240 B2 | 9/2006 | Wu et al. | |
| 7,128,987 B2 | 10/2006 | van de Veerdonk et al. | |
| 7,169,488 B2 | 1/2007 | Chen et al. | |
| 7,175,925 B2 | 2/2007 | Chen et al. | |
| 7,476,954 B2 * | 1/2009 | Wang et al. | 257/421 |
| 2008/0170329 A1 | 7/2008 | Thangaraj et al. | |
| 2009/0246557 A1 * | 10/2009 | Horng et al. | 428/811.1 |

OTHER PUBLICATIONS

"Current-driven excitation of magnetic multilayers," by J.C. Slonczewski et al., Journal of Magnetism and Magnetic Materials 159 (1996) L1-L7.
"Prediction and Confirmation of Perpendicular Magnetic Anisotropy in Co/Ni Multilayers," by G. H. O. Daalderop et al., Physical Review Letters, vol. 68, No. 5, Feb. 3, 1992, pp. 682-685.
"Magnetic anisotropies in Co/Ni(111) multilayers," by P.J. H. Bloemen et al., Journal of Applied Physics 72 (10), Nov.15, 1992, pp. 4840-4844, 1992 American Institute of Physics.

(Continued)

*Primary Examiner* — Alexander Sofocleous
(74) *Attorney, Agent, or Firm* — Saile Ackerman LLC; Stephen B. Ackerman

(57) ABSTRACT

A spin valve structure for a spintronic device is disclosed and includes a composite seed layer made of at least Ta and a metal layer having a fcc(111) or hcp(001) texture to enhance perpendicular magnetic anisotropy (PMA) in an overlying $(Co/Ni)_x$ multilayer. The $(Co/Ni)_x$ multilayer is deposited by a low power and high Ar pressure process to avoid damaging Co/Ni interfaces and thereby preserving PMA. As a result, only a thin seed layer is required. PMA is maintained even after annealing at 220° C. for 10 hours. Examples of GMR and TMR spin valves are described and may be incorporated in spin transfer oscillators and spin transfer MRAMs. The free layer is preferably made of a FeCo alloy including at least one of Al, Ge, Si, Ga, B, C, Se, Sn, or a Heusler alloy, or a half Heusler alloy to provide high spin polarization and a low magnetic damping coefficient.

29 Claims, 8 Drawing Sheets

OTHER PUBLICATIONS

"Perpendicular magnetic anisotropy of the epitaxial fcc Co/60-A-Ni/Cu (001) system," by Jaeyong Lee et al., Physical Review B, vol. 56, No. 10, Sep. 1, 1977-II, 1997 The American Physical Society., pp. R5728-R5731.

"Magnetic and magneto-optic properties of sputtered Co/Ni multilayers," by Y. B. Zhang et al., Journal of Applied Physics 75 (10), May 15, 1994, 1994 American Institute of Physics, pp. 6495-6497.

"Effect of [111] texture on the perpendicular magnetic anisotropy of Co/Ni multilayers," by V. M. Naik et al., Journal of Applied Physics, vol. 84, No. 6, Sep. 15, 1998, pp. 3273-3277.

"Co/Ni multilayers with perpendicular magnetic anisotropy: Kerr effect and thermomagnetic writing," by F. J. A. den Broeder et al., Applied Physics Letters 61 (12) Sep. 21, 1992, 1992 American Institute of Physics, pp. 1468-1470.

"Spin-torque drive ferromagnetic resonance of Co/Ni synthetic layers in spin valves," by W. Chen et al., Applied Physics Letters 92, 012507 (2008), 2008 American Institute of Physics, pp. 1-3.

"Microwave Assisted Magnetic Recording," by Jian-Gang Zhu et al., IEEE Transactions on Magnetics, vol. 44, No. 1, Jan. 2008, 2007 IEEE, pp. 125-131, 0018-9464.

* cited by examiner

FIG. 1b – Prior Art

THIN SEEDED CO/NI MULTILAYER FILM WITH PERPENDICULAR ANISOTROPY FOR SPINTRONIC DEVICE APPLICATIONS

FIELD OF THE INVENTION

The invention relates to a high performance spin valve such as a CPP-GMR (current perpendicular to plane-giant magnetoresistance) element or a magnetic tunnel junction (MTJ) and a method for making the same, and in particular, to a memory device that includes a spin valve structure having a composite seed layer with (111) texture to induce a preferred (111) orientation in an overlying laminated Co/Ni reference layer and thereby enhance perpendicular magnetic anisotropy (PMA) therein.

BACKGROUND OF THE INVENTION

Magnetoresistive Random Access Memory (MRAM), based on the integration of silicon CMOS with MTJ technology, is a major emerging technology that is highly competitive with existing semiconductor memories such as SRAM, DRAM, and Flash. Similarly, spin-transfer (spin torque or STT) magnetization switching described by C. Slonczewski in "Current driven excitation of magnetic multilayers", J. Magn. Magn. Mater. V 159, L1-L7 (1996), has recently stimulated considerable interest due to its potential application for spintronic devices such as STT-MRAM on a gigabit scale. Recently, J-G. Zhu et al. described another spintronic device called a spin transfer oscillator in "Microwave Assisted Magnetic Recording", IEEE Trans. on Magnetics, Vol. 44, No. 1, pp. 125-131 (2008) where a spin transfer momentum effect is relied upon to enable recording at a head field significantly below the medium coercivity in a perpendicular recording geometry.

Both MRAM and STT-MRAM have a MTJ element based on a tunneling magneto-resistance (TMR) effect wherein a stack of layers has a configuration in which two ferromagnetic layers are separated by a thin non-magnetic dielectric layer, or based on a GMR effect where a reference layer and free layer are separated by a metal spacer. The MTJ element is typically formed between a bottom electrode such as a first conductive line and a top electrode which is a second conductive line at locations where the top electrode crosses over the bottom electrode. A MTJ stack of layers may have a bottom spin valve configuration in which a seed layer, an anti-ferromagnetic (AFM) pinning layer, a ferromagnetic "pinned" layer, a thin tunnel barrier layer, a ferromagnetic "free" layer, and a capping layer are sequentially formed on a bottom electrode. The AFM layer holds the magnetic moment of the pinned layer in a fixed direction. The pinned or reference layer has a magnetic moment that is fixed in the "y" direction, for example, by exchange coupling with the adjacent AFM layer that is also magnetized in the "y" direction. The free layer has a magnetic moment that is either parallel or anti-parallel to the magnetic moment in the pinned layer. The tunnel barrier layer is thin enough that a current through it can be established by quantum mechanical tunneling of conduction electrons. The magnetic moment of the free layer may change in response to external magnetic fields and it is the relative orientation of the magnetic moments between the free and pinned layers that determines the tunneling current and therefore the resistance of the tunneling junction. When a sense current is passed from the top electrode to the bottom electrode in a direction perpendicular to the MTJ layers, a lower resistance is detected when the magnetization directions of the free and pinned layers are in a parallel state ("1" memory state) and a higher resistance is noted when they are in an anti-parallel state or " " memory state.

In a read operation, the information stored in a MRAM cell is read by sensing the magnetic state (resistance level) of the MTJ element through a sense current flowing top to bottom through the cell in a current perpendicular to plane (CPP) configuration. During a write operation, information is written to the MRAM cell by changing the magnetic state in the free layer to an appropriate one by generating external magnetic fields as a result of applying bit line and word line currents in two crossing conductive lines, either above or below the MTJ element. One line (bit line) provides the field parallel to the easy axis of the bit while another line (digit line) provides the perpendicular (hard axis) component of the field. The intersection of the lines generates a peak field that is engineered to be just over the switching threshold of the MTJ.

A high performance MRAM MTJ element is characterized by a high tunneling magnetoresistive (TMR) ratio which is dR/R where R is the minimum resistance of the MTJ element and dR is the change in resistance observed by changing the magnetic state of the free layer. A high TMR ratio and resistance uniformity (Rp_cov), and a low switching field (Hc) and low magnetostriction ($\lambda_S$) value are desirable for conventional MRAM applications. For Spin-MRAM (STT-MRAM), a high $\lambda_S$ and high Hc leads to high anisotropy for greater thermal stability. RA should be relatively small (about 4000 ohm-$\mu m^2$ or less) for MTJs that have an area defined by an easy axis and hard axis dimensions of less than 1 micron. Otherwise, R would be too high to match the resistance of the transistor which is connected to the MTJ.

As the size of MRAM cells decreases, the use of external magnetic fields generated by current carrying lines to switch the magnetic moment direction becomes problematic. One of the keys to manufacturability of ultra-high density MRAMs is to provide a robust magnetic switching margin by eliminating the half-select disturb issue. For this reason, a new type of device called a spin transfer (spin torque) device was developed. Compared with conventional MRAM, spin-transfer torque or STT-MRAM has an advantage in avoiding the half select problem and writing disturbance between adjacent cells. The spin-transfer effect arises from the spin dependent electron transport properties of ferromagnetic-spacer-ferromagnetic multilayers. When a spin-polarized current transverses a magnetic multilayer in a CPP configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high, and if the dimensions of the multilayer are small. The difference between a STT-MRAM and a conventional MRAM is only in the write operation mechanism. The read mechanism is the same.

Referring to FIG. 1a, a STT-MRAM structure 1 is shown and includes a gate 5 formed above a p-type semiconductor substrate 2, a source 3, drain 4, word line (WL) 6, bottom electrode (BE) 7, and bit line (BL) 9. There is also a MTJ element 8 formed between the bit line 9 and bottom electrode 7, and a via 10 for connecting the BE to the drain 4.

Materials with PMA are of particular importance for magnetic and magnetic-optic recording applications. Spintronic devices with perpendicular magnetic anisotropy have an advantage over MRAM devices based on in-plane anisotropy in that they can satisfy the thermal stability requirement but also have no limit of cell aspect ratio. As a result, spin valve structures based on PMA are capable of scaling for higher packing density which is one of the key challenges for future MRAM applications and other spintronic devices.

Materials exhibiting PMA such as CoPt, CoPt—$SiO_2$, Tb(Fe)Co, and FePt have been reported multiple times in publications. However, all of the literature examples suffer from at least one drawback. It is preferred that establishing a PMA property in a spin valve structure does not require strenuous heating. Unfortunately, FePt or Tb(Fe)Co need high temperature annealing to achieve high enough PMA which is unacceptable for device integration since certain components are damaged by high temperatures. CoPt and its alloys such as CoCrPt and CoPt—$SiO_2$ are not desirable because Pt and Cr are severe spin depolarizing materials and will seriously quench the amplitude of spintronic devices if incorporated in the spinvalve structures. That leaves the novel magnetic multilayer systems such as Co/X where X=Pt, Pd, Au, Ni, Ir, and the like for consideration. As stated above, Co/Pt, Co/Pd, and Co/Ir will not be good PMA materials for spintronic devices because of the severe spin depolarizing property of Pt, Pd, and Ir. Furthermore, Co/Pt, Co/Pd, and Co/Ir configurations typically require a very thick and expensive Pt, Pd, or Ir as a seed layer. Au is associated with high cost and easy interdiffusion to adjacent layers which makes a Co/Au multilayer for PMA purposes less practical. On the other hand, a Co/Ni multilayer configuration as a PMA material candidate has several advantages including (a) much higher spin polarization from Co, Ni, and Co/Ni interfaces, (b) better stability from the robustness of Ni layer insertion, (c) much higher saturation magnetization of 1 Tesla or about 2× higher than other Co/M combinations (M=metal), and (d) low cost.

PMA materials have been considered for microwave assisted magnetic recording (MAMR) as described by J-G. Zhu et al. in "Microwave Assisted Magnetic Recording", IEEE Trans. on Magn., Vol. 44, No. 1, pp. 125-131 (2008). A mechanism is proposed for recording at a head field significantly below the medium coercivity in a perpendicular recording geometry. FIG. 1b is taken from the aforementioned reference and shows an ac field assisted perpendicular head design. The upper caption 19 represents a perpendicular spin torque driven oscillator for generating a localized ac field in a microwave frequency regime and includes a bottom electrode 11a, top electrode 11b, perpendicular magnetized reference layer 12 (spin injection layer), metallic spacer 13, and oscillating stack 14. Oscillator stack 14 is made of a field generation layer 14a and a layer with perpendicular anisotropy 14b having an easy axis 14c. The ac field generator in the upper caption 19 is rotated 90 degrees with respect to the lower part of the drawing where the device is positioned between a write pole 17 and a trailing shield 18. The writer moves across the surface of a magnetic media 16 that has a soft underlayer 15. The reference layer 12 provides for spin polarization of injected current (I). Layers 14a, 14b are ferromagnetically exchanged coupled. Improved materials for the reference layer and oscillator stack are needed as this technology matures.

Several attempts disclosed in the literature have been made in order to achieve high PMA from Co/Ni multilayer configurations. However, all of the examples typically involve a very thick underlayer to establish PMA. For instance, G. Daalderop et al. in "Prediction and Confirmation of Perpendicular Magnetic Anisotropy in Co/Ni Multilayers", Phys. Rev. Lett. 68, 682 (1992) and F. den Broeder et al. in "Co/Ni multilayers with perpendicular magnetic anisotropy: Kerr effect and thermomagnetic writing", Appl. Phys. Lett. 61, 1648 (1992), use a 2000 Angstrom thick Au seed layer. In V. Naik et al., "Effect of (111) texture on the perpendicular magnetic anisotropy of Co/Ni multilayers", J. Appl. Phys. 84, 3273 (1998), and in Y. Zhang et al., "Magnetic and magneto-optic properties of sputtered Co/Ni multilayers", J. Appl. Phys. 75, 6495 (1994), a 500 Angstrom Au/500 Angstrom Ag composite seed layer is employed. Jaeyong Lee et al. in "Perpendicular magnetic anisotropy of the epitaxial fcc Co/60-Angstrom-Ni/Cu(001) system", Phys. Rev. B 57, RS728 (1997) describe a 1000 Angstrom thick Cu seed layer. A 500 Angstrom Ti or 500 Angstrom Cu seed layer with heating to 150° C. is used by P. Bloemen et al. in "Magnetic anisotropies in Co/Ni (111) multilayers", J. Appl. Phys. 72, 4840 (1992). W. Chen et al. in "Spin-torque driven ferromagnetic resonance of Co/Ni synthetic layers in spin valves", Appl. Phys. Lett. 92, 012507 (2008) describe a 1000 Angstrom Cu/200 Angstrom Pt/100 Angstrom Cu composite seed layer. The aforementioned seed layers are not practical with Co/Ni multilayer PMA configurations in spintronic devices. Typically, there is a space restriction in a direction perpendicular to the planes of the spin valve layers in advanced devices in order to optimize performance. Seed layers thicker than about 100 Angstroms will require thinning a different layer in the spin valve to maintain a certain minimum thickness for the spin valve which can easily lead to performance degradation.

Therefore, an improved seed layer is needed that is thin enough to be compatible with spintronic devices and which can induce high PMA in overlying Co/Ni multilayer structures.

SUMMARY OF THE INVENTION

One objective of the present invention is to provide a thin seed layer for a laminated $(Co/Ni)_x$ reference layer in a spin valve of a spintronic device that fully establishes the perpendicular magnetic anisotropy (PMA) in the $(Co/Ni)_x$ stack without causing spin depolarization or requiring a heat treatment that could degrade other components in the device.

A second objective of the present invention is to provide a method of forming a laminated $(Co/Ni)_x$ stack in a spin valve of a spintronic device so the face centered cubic (fcc) (111) super lattice in the Co and Ni layers and the interface between adjacent Co and Ni layers is preserved.

According to one embodiment, these objectives are achieved in a bottom spin valve configuration for spintronic device applications such as a read/write head, or spin-transfer oscillator devices for MRAM, or microwave assisted memory recording (MAMR). The spin valve structure is comprised of a stack of layers including a composite seed layer, [Co(t1)/Ni(t2)]$_x$ laminated reference layer where x is from about 5 to 70, Cu spacer, free layer, and a capping layer sequentially formed on a substrate. In the reference layer, each of the Co layers has a thickness (t1) from 0.5 to 5 Angstroms and each of the Ni layers has a thickness (t2) of 2 to 10 Angstroms. The seed layer preferably has a Ta/M1/M2 or Ta/M1 configuration where M1 is a metal having a fcc(111) or (hcp) hexagonal closed packed (001) crystal orientation such as Ru, and M2 is Cu, Ti, Pd, W, Rh, Au, or Ag. In the case of Pd, Au, and Ag, the M2 layer thickness is kept to a minimum in order to reduce cost and/or minimize any spin depolarization effect. The Ta and M1 layers in the composite seed layer are critical for enhancing the (111) texture in overlying layers. The free layer preferably has a high spin polarization and a small magnetic damping coefficient and may be comprised of FeCo and alloys thereof having at least one atom selected from Al, Ge, Si, Ga, B, C, Se, Sn, and the like. In an alternative embodiment, the free layer is a Heusler alloy such as $Co_2MnSi$, $Co_2FeSi$, $Co_2MnAl$, $Co_2FeAl$, $Co_2MnGe$, $Co_2FeGe$ or a half Heusler alloy comprised of CoMnSi, CoFeSi, CoMnAl, or CoFeGe.

In a second embodiment, a top spin valve structure is provided with a $[Co(t1)/Ni(t2)]_x$ laminated reference layer having a high PMA property. The top spin valve has a stack of layers comprised of a composite seed layer such as Ta/Ru/Cu, Ta/Ru, or Ta/Ru/A where A is Ti, Pd, W, Rh, Au, or Ag, a free layer, Cu spacer, $[Co(t1)/Ni(t2)]_x$ laminated reference layer, and capping layer sequentially formed on a substrate. The free layer and cap layer may have a composition as described in the first embodiment.

In a third embodiment, the Cu spacer in the aforementioned bottom spin valve configuration is modified by inserting a confining current path (CCP) nano-oxide layer (NOL) between upper and lower portions of the Cu spacer. For example, an amorphous oxide such as AlOx may be formed between two copper spacer layers in a Cu/AlOx/Cu configuration. In a CCP-CPP scheme, the Cu metal path is limited through an insulator template so that the MR ratio in the spin valve can be enhanced quite significantly.

There is a fourth embodiment based on a bottom spin valve configuration where the Cu spacer in the first embodiment (CPP-GMR) is replaced by a tunnel barrier layer such as AlOx or MgO to give a CPP-TMR structure.

In a fifth embodiment relating to a MAMR structure, a stack of layers comprised of a composite seed layer, reference layer with PMA, metal spacer, field generation layer, and PMA layer is sequentially formed between two electrodes. Each of the planes of the layers is oriented perpendicular to an ABS and between a write pole and a trailing shield in a PMR write head. The composite seed layer, laminated $(Co/Ni)_x$ reference layer, and metal spacer may be made of the same materials as in the first embodiment. The field generation layer may be CoFe or an alloy thereof. The PMA layer is ferromagnetically coupled with the field generation layer to form an oscillating stack in the MAMR configuration.

In all of the embodiments, once all the layers in the stack are laid down, a patterning and etching sequence is followed to fabricate a spin valve structure that may be in the shape of an oval, circle, or polygon from a top-down view.

An important feature of all embodiments is that each of the Co and Ni layers in the $(Co/Ni)_x$ laminate is deposited with a very low RF power and a high inert gas pressure to minimize the impinging ion energy so that deposition of a layer does not damage the Co or Ni layer on which it is formed. Thus, the interfaces between the Co and Ni layers are preserved to maximize the PMA property. Furthermore, this method enables the PMA of $(Co/Ni)_x$ laminates to be preserved with a substantially thinner seed layer.

BRIEF DESCRIPTION OF THE DRAWINGS

FIG. 1b is a schematic illustration of a MAMR recording head with an ac field assisted perpendicular head design according to a prior art reference.

DETAILED DESCRIPTION OF THE INVENTION

The present invention is a CPP spin valve structure that includes a $(Co/Ni)_x$ laminated reference layer with perpendicular magnetic anisotropy that is fully established with a thin composite seed layer comprised of a lower Ta layer and an upper metal layer with fcc(111) or hcp(001) crystal orientation for enhanced performance in spin transfer oscillators including MAMR devices, STT-MRAM devices, and in other spintronic devices. The present invention also includes a method of depositing the $(Co/Ni)_x$ laminated reference layer such that the Co/Ni interfaces are well preserved and only a thin seed layer is required for establishing the desired fcc (111) orientation. Drawings are provided by way of example and are not intended to limit the scope of the invention.

In principle, the magnetic anisotropy of a $(Co/Ni)_x$ laminated structure arises from the spin-orbit interactions of the 3d and 4s electrons of Co and Ni atoms. Such interaction causes the existence of an orbital moment which is anisotropic with respect to the crystal axes which are in (111) alignment, and also leads to an alignment of the spin moment with the orbital moment. In $(Co/Ni)_x$ laminated structures, it is essential to have a fcc (111) super-lattice in order to establish PMA. As mentioned previously, prior art structures rely on assistance from a thick seed layer having a perfect fcc structure such as Au, Au/Ag, Ti, Cu, and Au/Cu to establish PMA in a $(Co/Ni)_x$ multilayer configuration. In the G. Daalderop and F. den Broeder references mentioned previously, it is believed that the PMA effect is established by the presence of an interface between ultra-thin layers of closed packed Co and Ni atoms. Since Co and Ni differ only by one valence electron, the existence of Co and Ni interfaces will give rise to a large magnetic anisotropy.

In the present invention, we have discovered a method for depositing Co and Ni layers that preserves the interfaces of the laminated Co and Ni layers thereby requiring a substantially thinner seed layer. Moreover, once the number of laminations (x) in the $(Co/Ni)_x$ structure disclosed herein reaches a large enough number between about 5 and 70, there is a sufficient quantity of Co and Ni valence electrons to generate a high PMA for spintronics applications from the spin-orbit interactions. In one aspect, a composite seed layer represented by Ta/M1 where M1 is an upper metal layer having a fcc(111) or hcp(001) crystal orientation such as Ru, Cu, or Au provides an additional advantage of enhancing the (111) texture in overlying spin valve structures thereby optimizing the PMA in the laminated reference layer.

First, various embodiments of a spin valve structure according to the present invention will be described and then a method for forming a $(Co/Ni)_x$ laminated structure which preserves the Co/Ni interfaces will be provided.

Figure 1A:
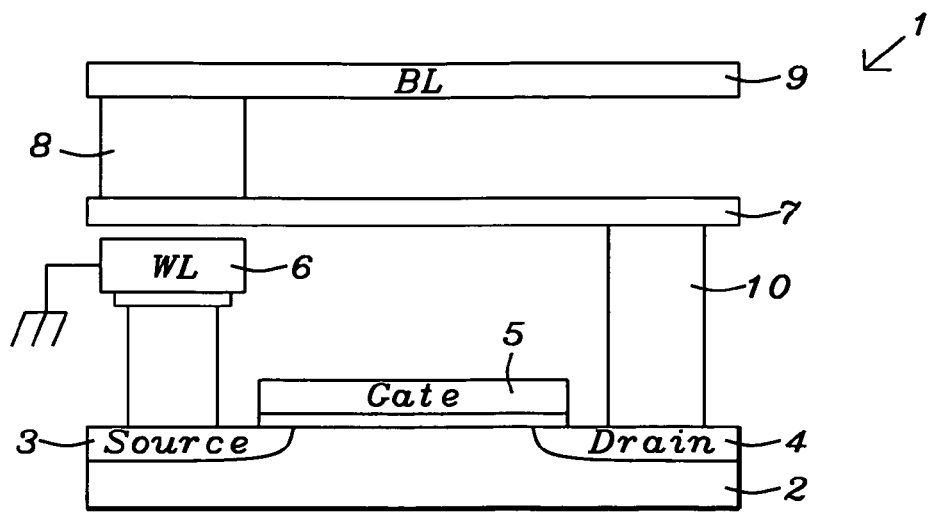
FIG. 1a is a cross-sectional view showing a memory cell in a conventional STT-MRAM device.
Figure 2:
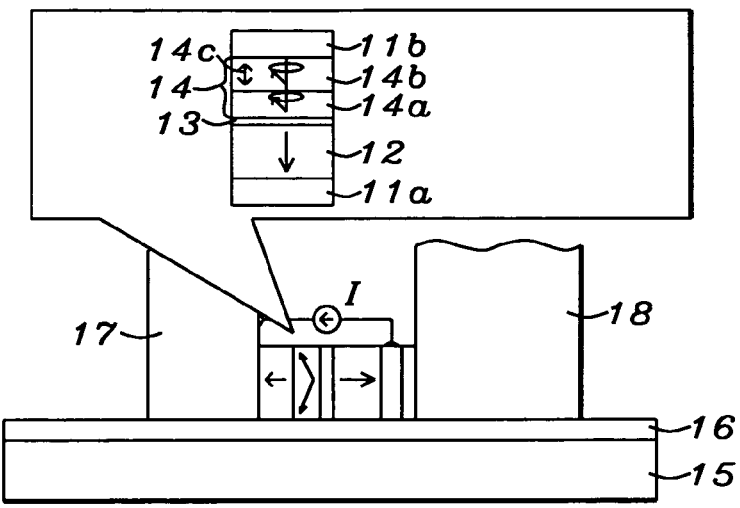
FIG. 2 is cross-sectional view of a CPP-GMR bottom spin valve structure according to a first embodiment of the present invention.
Figure 2:
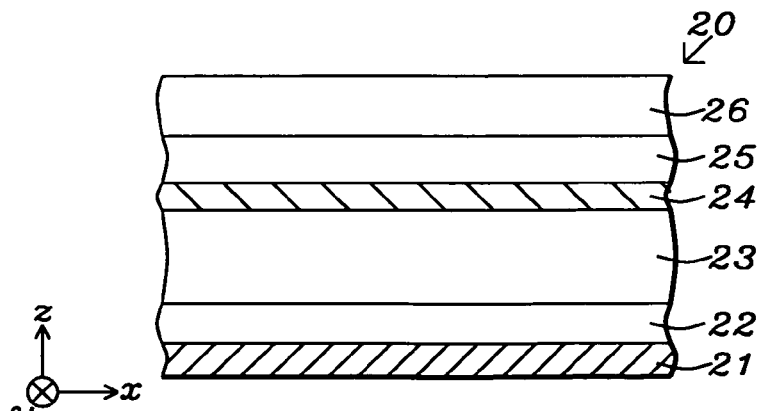

Referring to FIG. 2, a cross-sectional view of a bottom spin valve structure 20 is depicted according to one embodiment of the present invention. In this case, the spin valve structure 20 has a CPP-GMR configuration. A substrate 21 is shown that may be a bottom electrode layer, for example. One key feature of the present invention is the composite seed layer 22 (individual layers not shown) disposed on the substrate 21. The composite seed layer 22 has a fcc(111) lattice and may be comprised of a Ta/Ru/Cu configuration where a lower Ta layer having a thickness of 5 to 100 Angstroms contacts the substrate 21, a middle Ru layer about 10 to 100 Angstroms thick is formed on the Ta layer, and an upper Cu layer 1 to 100 Angstroms thick is formed on the Ru layer. In another aspect, the upper Cu layer may be removed and a Ta/Ru composite seed layer 22 is employed wherein the Ta and Ru layers have thicknesses of 5 to 100 Angstroms, and 10 to 100 Angstroms, respectively. Optionally, Ru may be replaced by a metal M1 layer having a fcc(111) or hcp(001) lattice structure.

In another embodiment, the upper Cu layer in the trilayer seed layer configuration may be replaced by a metal M2 such as Ti, Pd, W, Rh, Au, Ag, or the like with a thickness for M2 of from 1 to 100 Angstroms to give a Ta/M1/M2 configuration where M1 is unequal to M2. However, it is critical that the composite seed layer 22 be comprised of a lower Ta layer and at least one metal layer having fcc(111) or hcp(001) crystal orientation on the Ta layer to enhance the (111) crystal structure in other layers in the spin valve thereby enlarging the PMA magnitude in an overlying $(Co/Ni)_x$ laminated layer. In another embodiment, the composite seed layer may comprise NiCr and at least one of Ta and Ru.

Above the composite seed layer 22 is a reference layer 23 that preferably has a $(Co/Ni)_x$ laminated structure where x is between about 5 and 70 depending on the Mst requirement. Each of the plurality of Co layers in the laminated reference layer 23 has a thickness from 0.5 to 5 Angstroms, and preferably between 1.5 to 3 Angstroms. Each of the plurality of Ni layers in the laminated reference layer has a thickness from 2 to 10 Angstroms, and preferably between 3.5 and 8 Angstroms. Preferably, the thickness t2 of a Ni layer is greater than a Co layer thickness t1, and more preferably, t2~2×t1 in order to optimize the spin orbit interactions between adjacent Co and Ni layers. In addition, Co and Ni layers are deposited by a method that preserves the Co/Ni interfaces as described in a later section. In one aspect, when t1 is less than or equal to about 2 Angstroms, the Co layer may be considered as a "close-packed" layer and not necessarily having a (111) crystal orientation.

There is a metallic spacer 24 formed on the laminated reference layer 23 and having a thickness from 15 to 150 Angstroms, and preferably between 20 to 60 Angstroms. Preferably, the metallic spacer 24 is non-magnetic, comprised of Cu, and sufficiently thick to prevent coupling between the reference layer 23 and free layer 25. Moreover, a Cu spacer is selected because of having excellent conductivity to enable a current to pass through the spin valve stack of layers 22-26 in a perpendicular to plane direction during a read or write process.

A free layer 25 is disposed on the Cu spacer and preferably has a high spin polarization and a small magnetic damping coefficient in order to enable spin transfer magnetization switching in the spintronic device. The free layer is a magnetic (ferromagnetic) layer made of FeCo or an alloy thereof containing at least one atom selected from Al, Ge, Si, Ga, B, C, Se, and Sn and has a magnetic moment aligned along an easy axis direction that is switched to an opposite direction when a spin torque of sufficient magnitude is applied. Free layer 25 may also be comprised of a Heusler alloy such as $Co_2MnSi$, $Co_2FeSi$, $Co_2MnAl$, $Co_2FeAl$, $Co_2MnGe$, $Co_2FeGe$ or a half Heusler alloy comprised of CoMnSi, CoFeSi, CoMnAl, or CoFeGe.

In another aspect related to a spin transfer oscillator device in a MAMR embodiment, the free layer 25 may be considered the oscillator layer and the $(Co/Ni)_x$ reference layer 23 may represent a spin injection layer.

The uppermost layer in the spin valve stack is a composite capping layer 26. In one aspect, the capping layer 26 has a Ru/Ta/Ru configuration where the upper Ru layer is used to provide oxidation resistance and excellent electrical contact to an overlying top electrode (not shown). A substantial reduction in critical current density (Jc) occurs when a thin Ru layer is employed as a capping layer due to the strong spin scattering effect of Ru. Critical current density (Jc) is preferably about $10^6$ A/cm$^2$ to be viable for spin-transfer magnetization switching in the 90 nm technology node and beyond. Higher values could destroy a thin tunnel barrier made of AlOx, MgO, or the like as employed in the fourth embodiment of the present invention. The Ta layer may be included to offer etch resistance in subsequent processing steps. Optionally, other capping layer materials used in the art may be used as capping layer 26.

Figure 3:
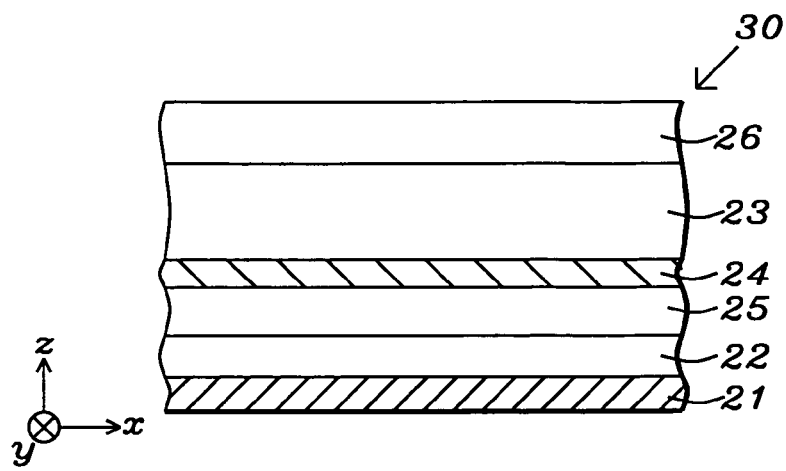
FIG. 3 is a cross-sectional view of a CPP-GMR top spin valve structure according to a second embodiment of the present invention.

In a second embodiment depicted in FIG. 3 that also relates to a CPP-GMR structure, a top spin valve configuration is shown. The top spin valve structure 30 includes the same layers as previously mentioned for bottom spin valve 20. However, the locations of the $(Co/Ni)_x$ laminated reference layer 23 and free layer 25 are switched such that the free layer now contacts the composite seed layer 22 and the laminated reference layer is formed on the Cu spacer 24. The thin composite seed layer 22 with (111) crystal orientation is still critical in fully establishing PMA in laminated reference layer 23 even though layers 22, 23 are not in direct contact since the composite seed layer induces (111) lattice formation in all overlying layers.

Figure 4:
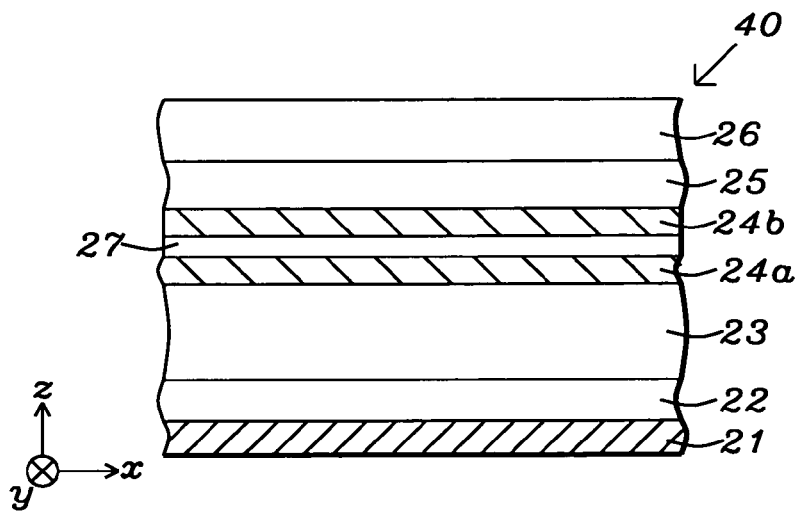
FIG. 4 is a cross-sectional view of a CPP-GMR bottom spin valve having a CCP-NOL layer according to a third embodiment of the present invention.

Referring to FIG. 4, a third embodiment of the present invention is illustrated and relates to a bottom spin valve structure 40 with a modified CPP-GMR configuration called a confining current path (CCP)CPP GMR sensor where the current through the Cu spacer is limited by the means of segregating metal path and oxide formation. With a CCP-CPP scheme, the Cu metal path is limited through an insulator template or nano-oxide layer (NOL) so that the MR ratio can be significantly enhanced. Thus, bottom spin valve 40 is similar to bottom spin valve 20 in the first embodiment except that the Cu spacer 24 is now divided into two parts which are a lower Cu layer 24a and an upper Cu layer 24b separated by a nano-oxide layer 27. NOL layer 27 may be formed by depositing an AlCu layer on the lower Cu layer 24a, followed by a pre-ion treatment (PIT) and an ion-assisted oxidation (IAO) process to convert the AlCu layer into an AlOx matrix having segregated Cu pathways (current confining paths) therein. Thereafter, upper Cu layer 24b is deposited on the NOL (CCP) layer 27. The remaining layers 22-23, 25-26 are the same as described previously with respect to FIG. 2.

Figure 5:
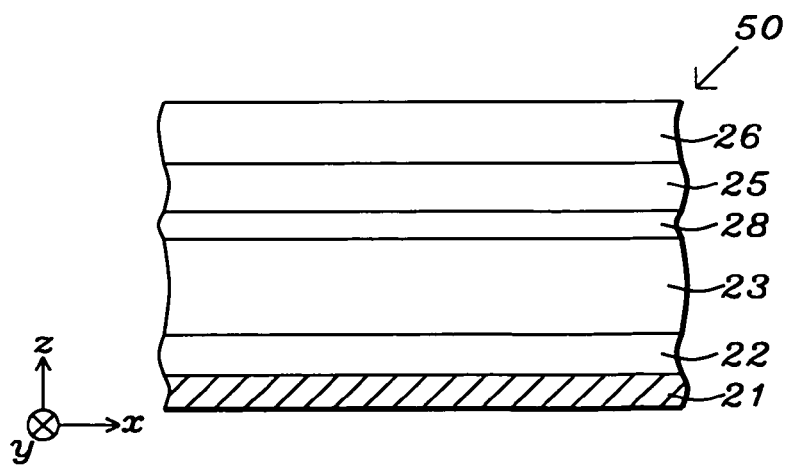
FIG. 5 is a cross-sectional view of a CPP-TMR bottom spin valve structure according to a fourth embodiment of the present invention.

Referring to FIG. 5, a fourth embodiment is depicted that relates to a CPP TMR bottom spin valve structure 50. Note that the Cu spacer 24 has been replaced by a tunnel barrier layer 28 which may be comprised of AlOx, MgO, TiOx, TiAlOx, MgZnOx, ZnOx, or other metal oxides or metal nitrides typically employed as insulator layers. Formation of a MgO tunnel barrier 28 preferably comprises deposition of a first Mg layer on the laminated reference layer 23, oxidation of the first Mg layer by a natural oxidation (NOX) or radical oxidation (ROX) process, and then deposition of a second Mg layer on the MgO layer. During a subsequent annealing step, the oxygen in the MgO layer typically diffuses into the second Mg layer to form an essentially uniform MgO tunnel barrier layer 28. A NOX process is preferred over a ROX process when a RA target of less than about 20 ohm-$\mu m^2$ is desired since ROX processes tend to give higher RA values. The NOX process is preferably performed in an oxidation chamber within the sputter deposition system. NOX process conditions may be comprised of a 1 torr pressure and an oxygen flow rate of from 0.1 to 1.0 slm and preferably 1 slm for about 100 to 200 seconds to oxidize the first Mg layer. Other layers 22-23 and 25-26 in bottom spin valve structure 50 are the same as previously described with respect to bottom spin valve structure 20 in FIG. 2.

Figure 12:
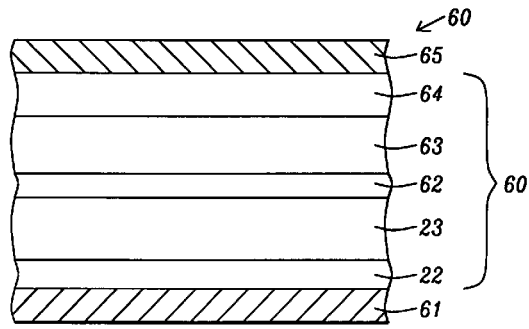
FIG. 12 is a cross-sectional view of an ac field generator structure of a MAMR design according to a fifth embodiment of the present invention.

Referring to FIG. 12, a fifth embodiment of the present invention is depicted that relates to a MAMR structure 60. In the exemplary embodiment, a composite seed layer 22, laminated $(Co/Ni)_x$ reference layer 23, metal spacer 62, field generation layer 63, and a PMA layer 64 are sequentially formed on a first electrode 61 in a bottom spin transfer oscillator (STO) structure. A second electrode 65 contacts the top surface of the PMA layer 64. As mentioned previously, the laminated reference layer 23 serves as a spin injection layer for the MAMR device. The metal spacer 62 may be comprised of Cu or another metal or alloy with high conductivity as appreciated by those skilled in the art. Field generation layer 63 is a magnetic (ferromagnetic) layer and may be made of FeCo or an alloy thereof with a high spin polarization and a small magnetic damping coefficient in order to enable spin transfer magnetization switching similar to free layer 25 in previous embodiments. Field generation layer 63 functions as an oscillator layer having a magnetic moment that is capable of switching from one direction along an easy axis (not shown) to an opposite direction when sufficient spin torque is applied. PMA layer 64 is ferromagnetically coupled to field generation layer 63. A key feature is that the composite seed layer 22 having a Ta/M1 or Ta/M1/M2 configuration enhances the (111) lattice structure and PMA in laminated reference layer 23. Moreover, laminated reference layer 23 is formed in a manner that preserves the Co/Ni interfaces formed therein. Note that the present invention also includes a bottom STO structure which is similar to FIG. 12 except the positions of field generation layer 63 and reference layer 23 are switched.

Figure 13:
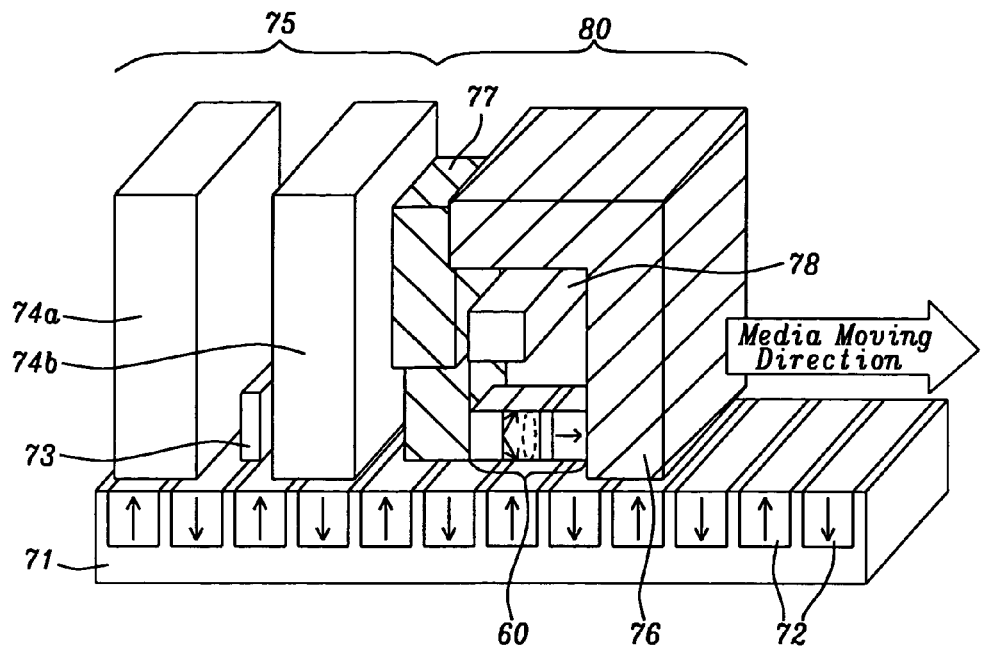
FIG. 13 is a cross-sectional view of a merged read-write head wherein a "top" STO writer comprised of a main pole, write shield, and spin transfer oscillator structure is formed according to an embodiment of the present invention.

Referring to FIG. 13, the MAMR structure or spin transfer oscillator (STO) 60 may be formed in a write head 80. In the exemplary embodiment, the STO writer 80 is pictured as part of a merged read-write head where the read head 70 includes top and bottom shields 74a, 74b, and a sensor 73 between the aforementioned shields. STO writer 80 is comprised of a main pole 76, a trailing shield 77 and a wire 78 for injecting current into the spin transfer oscillator structure 60 which is shown in a "top" STO configuration. The "top" STO configuration has a laminated reference layer proximate to the main pole layer 76 and with a magnetization aligned in the same direction as the media moving direction. Note that the oscillator layer is formed closer to the first electrode (trailing shield 77) than the reference layer and has a magnetization direction which is free to rotate as indicated by the layer with two arrows and a dotted circle in imbedded structure 60.

Figure 14:
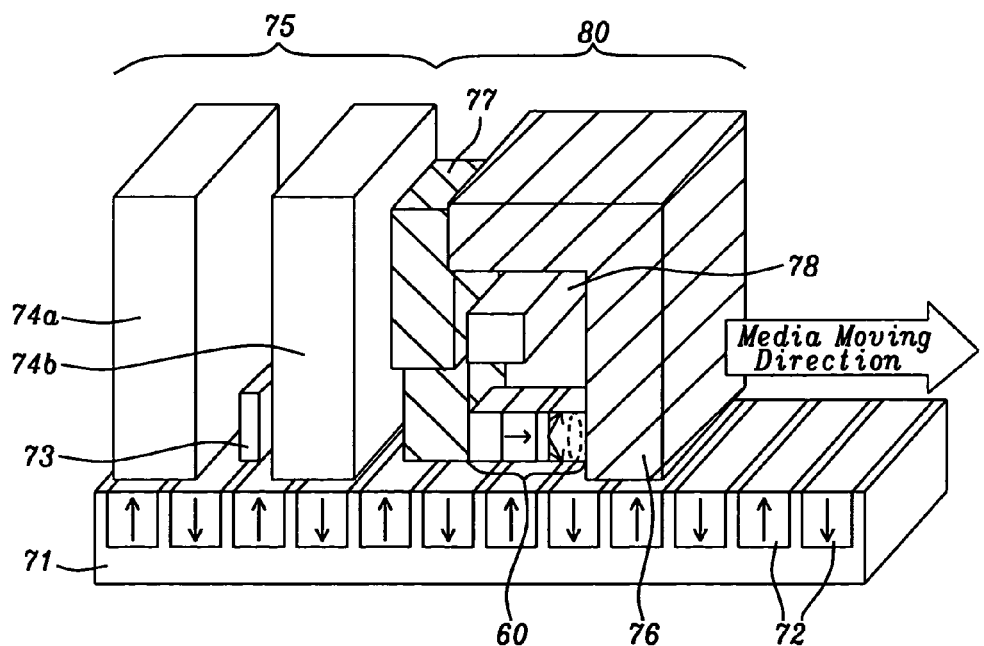
FIG. 14 is a cross-sectional view of a merged read-write head wherein a "bottom" STO writer comprised of a main pole, write shield, and spin transfer oscillator structure is formed according to an embodiment of the present invention.

In an alternative embodiment as depicted in FIG. 14, the positions of the field generation (oscillator) layer and reference layer may be switched to give a "bottom" STO configuration. A top surface of STO structure 60 adjoins a side of the main pole 76 that faces the read head 75 while a bottom surface of STO structure 60 adjoins a side of the trailing shield opposite the read head. The merged read-write head moves in the direction indicated while suspended on an air bearing surface above substrate 71 having media tracks 72 formed thereon. In one aspect, trailing shield 77 replaces first electrode 61 and main pole 76 replaces the second electrode 62 in FIG. 12.

With regard to a process of forming the various spin valve structures of the aforementioned embodiments, all of the layers in the CPP spin valve stack may be laid down in a sputter deposition system. For instance, the CPP stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas with ultra-high vacuum and the targets are made of metal or alloys to be deposited on a substrate. All of the CPP layers may be formed after a single pump down of the sputter system to enhance throughput.

The present invention also encompasses an annealing step after all layers in the CPP spin valve structure have been deposited. The CPP spin valve structures 20, 30, 40, 50, 60 may be annealed by applying a temperature between 200° C. and 280° C. for a period of 0.5 to 10 hours. No applied magnetic field is necessary during the annealing step because PMA is established due to the (111) texture in the composite seed layer 22 and due to the Co—Ni spin orbital interactions in the laminated reference layer 23.

An important feature of the present invention is the method for depositing the $(Co/Ni)_x$ laminated reference layer 23. In particular, a lower RF power and high Ar pressure are utilized to avoid damaging the substrate on which each Co or Ni layer is deposited in order to preserve the resulting Co/Ni interfaces and enhance the PMA property therein. In other words, the ion energy impinging on recently deposited Co and Ni surfaces is minimized during sputter deposition of subsequent Co and Ni layers to reduce damage from ion bombardment during the sputtering process. In one embodiment, each of the Co and Ni layers in the laminated reference layer 23 is laid down in a DC magnetron sputter deposition chamber by a process comprising a RF power of less than 200 Watts, and an Ar flow rate of >15 standard cubic centimeters per minute (sccm). Deposition of each Co and Ni layer requires less than a minute and total time necessary to form a $(Co/Ni)_{20}$ structure is less than about an hour.

Once all the layers in the spin valve structures 20, 30, 40, 50, 60 are formed, the spin valve stack is patterned into an oval, circular, or other shapes from a top-down perspective along the z-axis by a well known photoresist patterning and reactive ion etch transfer sequence. Thereafter, an insulation layer (not shown) may be deposited on the substrate 21 (or 61) followed by a planarization step to make the insulation layer coplanar with the capping layer 26 (or PMA layer 64). Next, a top electrode such as second electrode 65 may be formed on the uppermost layer 64 (or 26) as appreciated by those skilled in the art.

Example 1

An experiment was conducted to demonstrate the effectiveness of forming a $(Co/Ni)_x$ laminated reference layer in minimizing the required thickness of the seed layer in a spin valve stack. A partial spin valve stack comprised of a Cu seed layer, $(Co/Ni)_{20}$ laminated layer where each Co layer is 2 Angstroms thick and each Ni layer is 4 Angstroms thick, and a Ru10/Ta40/Ru30 cap layer was fabricated in order to obtain PMA values from MH curves using a vibrating sample magnetometer (VSM). The thickness of each layer in the composite cap layer is shown by the number following each of the elements. Copper seed layer thickness was reduced from 1000 Angstroms in FIG. 6a to 500 Angstroms in FIG. 6b, 200 Angstroms in FIG. 6c, and to 100 Angstroms in FIG. 6d. The upper plot in each figure shows the horizontal to plane component of each magnetic field and the lower plot in each figure illustrates the perpendicular magnetic anisotropy (PMA) component. It should be understood that the distances $s_1$-$s_4$ between the mostly vertical portions in the lower plots are proportional to the PMA magnitude. Clearly, PMA can be maintained even with a Cu seed layer as thin as 100 Angstroms although PMA decreases somewhat as the Cu seed layer is thinned. Furthermore, from torque measurements, we deduced that Hk for each $(Co/Ni)_{20}$ stack having a 100 Angstrom thick Cu seed layer is >15000 Oersted (Oe).

Example 2

Figure 6A:
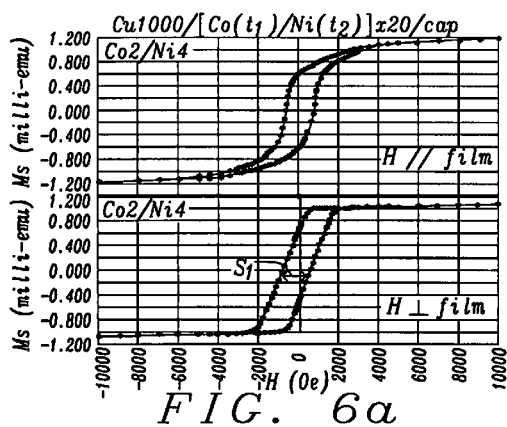
FIGS. 6a-6d are MH curves showing the effect of Cu seed layer thickness on the PMA in an overlying $(Co/Ni)_{20}$ multilayer structure.
Figure 6B:
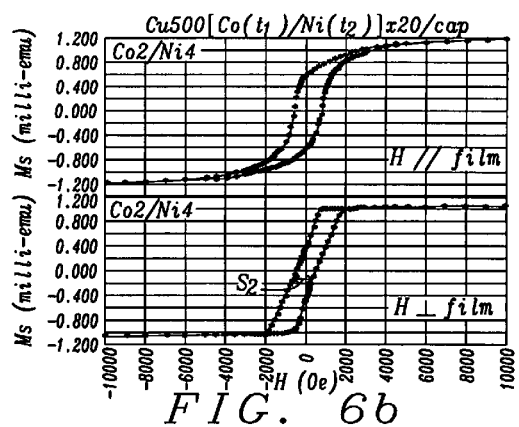
Figure 6C:
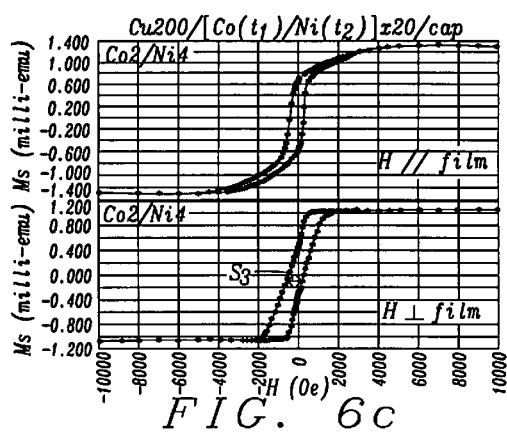
Figure 6D:
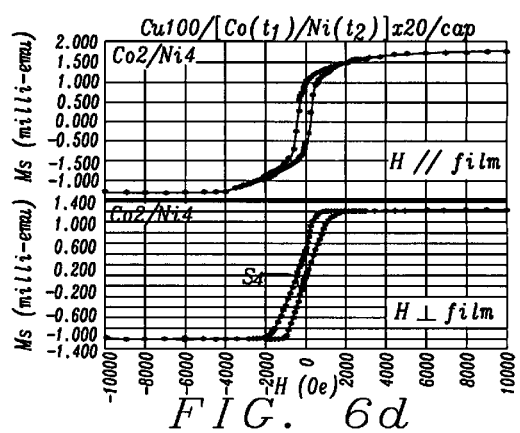
Figure 7A:
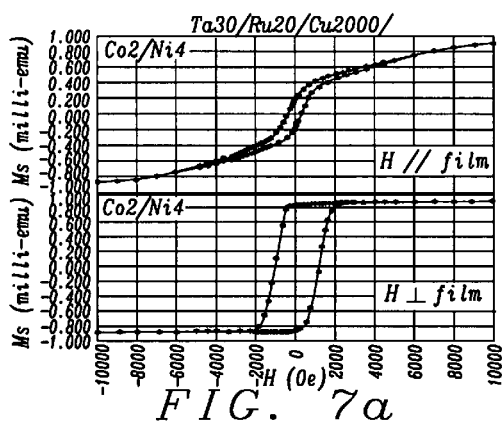
FIGS. 7a-7d are MH curves showing how the Cu thickness in a Ta/Ru/Cu composite seed layer affects the PMA in an overlying $(Co/Ni)_{20}$ multilayer structure.
Figure 7B:
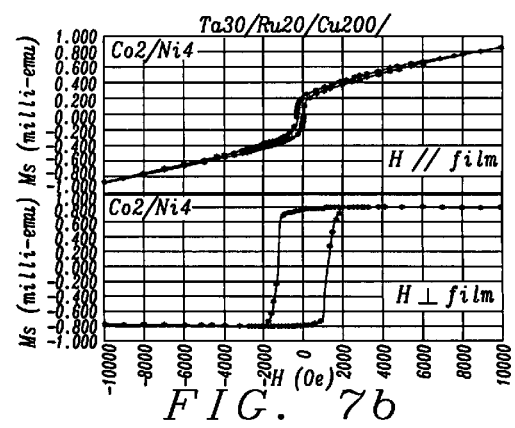
Figure 7C:
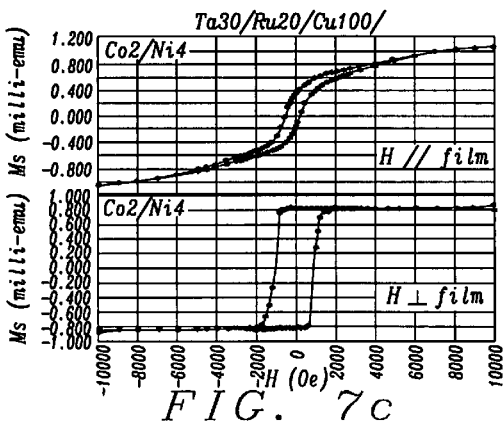
Figure 7D:
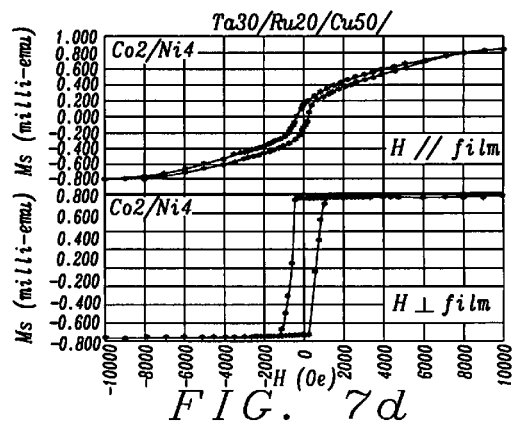

In a second experiment, a Ta/Ru underlayer was inserted to form a Ta/Ru/Cu seed layer and further enhance the (111) texture of the upper Cu layer according to an embodiment of the present invention. The lower Ta layer thickness is 30 Angstroms and the middle Ru layer thickness is 20 Angstroms. The other layers in the partial spin valve stack have the same composition and thickness as indicated in the previous example. As a result, PMA is further improved with respect to FIGS. 6a-6d as indicated by the MH curves in FIGS. 7a-7d. Note that the distance $s_5$ in FIG. 7c is greater than $s_4$ where the Cu layer in both cases is 100 Angstroms thick. Those skilled in the art will also recognize that the sloped portions of the curves in FIGS. 7a-7d are more vertical than the sloped portions in FIGS. 6a-6d which represents improved perpendicular magnetic properties. The thickness of the upper Cu layer in the composite seed layer is reduced from 2000 Angstroms in FIG. 7a, to 200 Angstroms in FIG. 7b, 100 Angstroms in FIG. 7c, and to 50 Angstroms in FIG. 7d. Even with a thin 50 Angstrom Cu layer (FIG. 7d), there is a PMA improvement over FIG. 6a representing the thick (1000 Angstrom) Cu seed layer. Hk is confirmed by torque measurements to be larger than 15000 Oe even with a very thin Ta30/Ru20/Cu50 seed layer.

Example 3

Figure 8A:
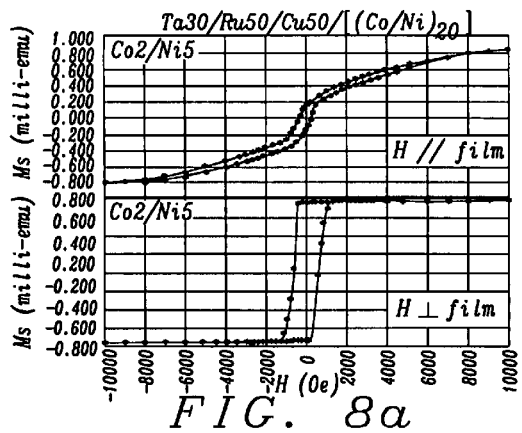
FIGS. 8a-8c are MH curves showing how the Cu layer in a Ta/Ru/Cu composite seed layer can be thinned or removed while still preserving the PMA in an overlying Co/Ni laminated structure according to one embodiment of the present invention.
Figure 8B:
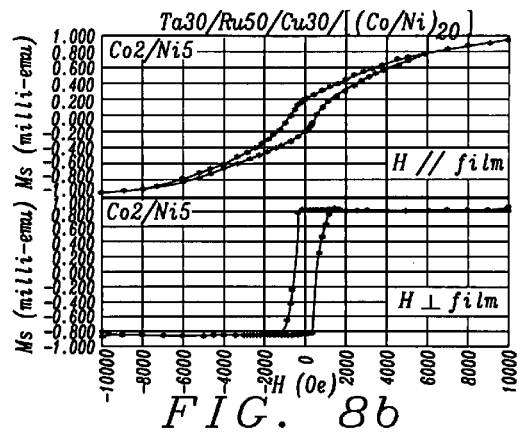
Figure 8C:
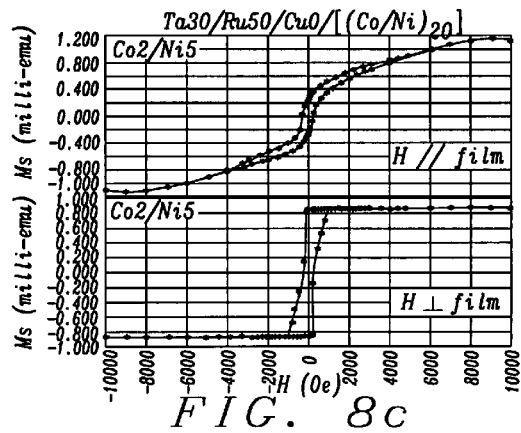

To further explore the effect of thinning the upper Cu layer in the composite seed layer described in Example 2, the upper Cu layer was thinned from 50 Angstroms in FIG. 8a to 30 Angstroms in FIG. 8b, and completely removed in FIG. 8c. Note that the resulting seed layer has a 30 Angstrom thick Ta layer and a 50 Angstrom thick Ru layer in the Ta/Ru configuration. In addition, the thickness of each Ni layer in the $(Co/Ni)_{20}$ stack was increased slightly to 5 Angstroms. We have found that excellent PMA properties are retained in the $(Co/Ni)_{20}$ multilayer even when the Cu layer in the composite seed layer is removed as illustrated in FIG. 8c.

Example 4

Figure 9:
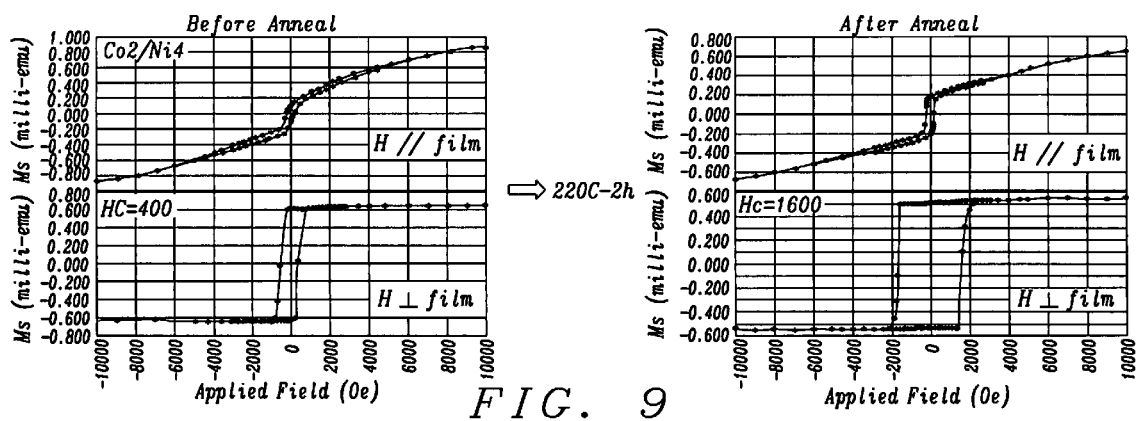
FIG. 9 are MH curves showing the effect of annealing on the PMA in a Ta30/R50/Cu100/$[Co(2)/Ni(5)]_{20}$/R10/Ta40/R30 multilayer structure formed according to an embodiment of the present invention.

A stack comprised of a Ta30/Ru50/Cu100 composite seed layer, a middle $(Co/Ni)_{20}$ laminated layer, and an upper composite Ru10/Ta40/Ru30 cap layer was annealed at 220° C. for 2 hours. No applied magnetic field during annealing is necessary to establish PMA. However, PMA does increase substantially during the annealing step as indicated in FIG. 9 where the left side of the figure depicts MH curves for parallel (upper) and perpendicular (lower) magnetic components prior to annealing and the right side of the figure shows the MH curves after the annealing process. Each of the Co layers has a 2 Angstom thickness and each of the Ni layers has a 5 Angstrom thickness in FIG. 9. Typical Ku and Hk results from an annealed structure such as the one described above are about 5.64E+06 erg/cc and 17161 Oe, respectively.

Example 5

Figure 10:
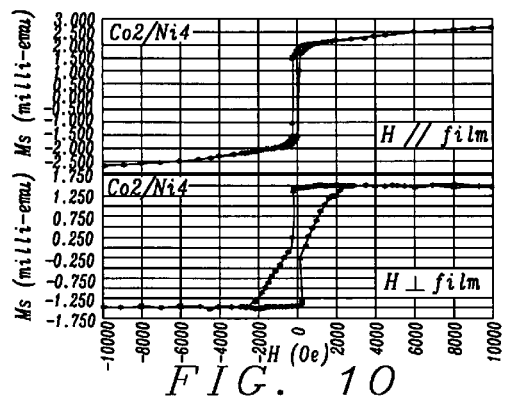
FIG. 10 is an MH curve showing PMA in a bottom CPP-GMR spin valve structure according to a first embodiment of the present invention.

According to a preferred embodiment of the present invention, a bottom CPP-GMR spin valve stack of layers was fabricated with the following configuration in which the value following each individual layer represents the film thickness in Angstroms: Ta30/Ru50/Cu50/[(Co2/Ni4)$_{20}$]/Cu30/FeCoAl200/Ru 10/Ta40/Ru30. In the aforementioned structure, Ta/Ru/Cu is the composite seed layer, the Co/Ni laminate is the reference layer, Cu is a spacer, $(Fe_{50}Co_{50})_{80}Al_{20}$ is the free layer, and Ru/Ta/Ru is the composite cap layer. FIG. 10 illustrates a MH curve for the parallel to plane magnetic anisotropy component (upper plot) and a MH curve for the PMA component (lower plot). It is clearly shown that the PMA of the $(Co/Ni)_{20}$ laminated reference layer is well preserved. Moreover, we expect good GMR properties such as high MR ratio as well. Note that the "soft" or sloped part of the lower MH curve for PMA is associated with the magnetization of the FeCoAl layer.

Example 6

Figure 11A:
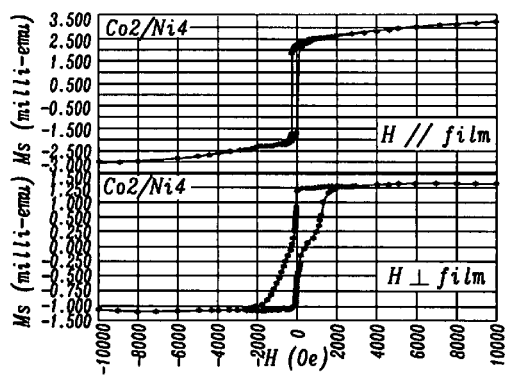
FIG. 11a is a MH curve showing PMA in a top CPP-GMR spin valve structure according to a second embodiment of the present invention.
Figure 11B:
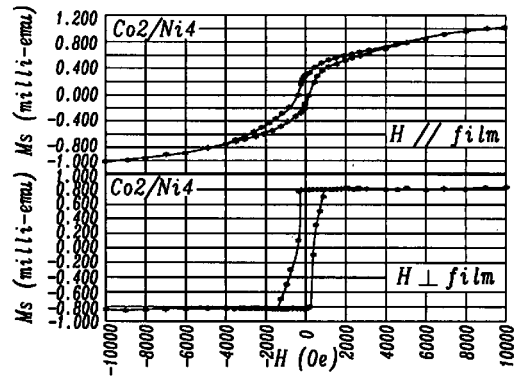
FIG. 11b shows PMA in a similar stack of layers but where the magnetic FeCoAl free layer (FIG. 11a) is replaced by a non-magnetic FeCoAl layer (FIG. 11b).

According to a second embodiment of the present invention, a top CPP-GMR spin valve stack of layers was fabricated with the following configuration in which the value following each individual layer represents the film thickness in Angstroms: Ta30/Ru50/Cu50/FeCoAl200/Cu50/[(Co2/Ni4)$_{20}$]/Ru 10/Ta40/Ru30. In this configuration, a composite seed layer, FeCoAl free layer, Cu spacer, laminated reference layer, and cap layer are sequentially formed on an alumina substrate for the purpose of obtaining magnetic measurements. MH curves for the aforementioned top spin valve are shown in FIG. 11a with the PMA component in the bottom plot. For comparative purposes, a similar structure was fabricated with a non-magnetic FeCoAl200 layer. MH curves for a stack comprised of a non-magnetic FeCoAl200 layer are shown in FIG. 11b. Note in FIG. 11a that even with a top spin valve structure, the PMA of a Co/Ni laminated reference layer can be maintained which is typically extremely difficult for other PMA materials such as CoPt. In addition, excellent GMR properties are achieved.

Example 7

A bottom CPP-GMR spin valve structure with a current confining path (CCP) layer formed between a laminated (Co/Ni)$_{20}$ reference layer and a free layer was fabricated according to a third embodiment of the present invention. The spin valve structure is represented by Ta30/Ru50/Cu50/[(Co2/Ni4)$_{20}$]/Cu5.2/AlCu 10/PIT/IAO/Cu4/FeCoAl200/Ru10/Ta40/Ru30. It should be understood that the PIT and IAO processes as described previously convert the AlCu layer into an AlOx matrix with current confining Cu paths therein. The CCP layer is expected to enhance the MR ratio as well as reduce the current density as desired in a spintronic device based on spin transfer switching of the free layer.

Example 8

A bottom CPP-TMR spin valve structure with a AlOx or MgO tunnel barrier layer formed between a laminated (Co/Ni)$_{20}$ reference layer and a free layer was fabricated according to a fourth embodiment of the present invention. The spin valve structure is represented by Ta30/Ru50/Cu50/[(Co2/Ni4)$_{20}$]/AlOx or MgO/FeCoAl200/Ru10/Ta40/Ru30. In this example, the AlOx or MgO tunnel barrier layer is expected to increase the MR ratio above the values achieved in Examples 5 and 6.

We have described various embodiments of bottom spin valve and top spin valve structures having a thin seed layer with a fcc (111) lattice configuration that enhances perpendicular magnetic anisotropy in an overlying (Co/Ni)$_x$ laminated reference layer even following an anneal process. The invention may be applied to various spintronic devices such as spin transfer oscillators for MRAM and for MAMR recording for head applications that are based on GMR spin valves or on TMR spin valves. The thin seed layer is enabled by a deposition method for Co and Ni films that preserves the Co/Ni interfaces and thereby maintains PMA therein to provide improved performance.

While this invention has been particularly shown and described with reference to, the preferred embodiment thereof, it will be understood by those skilled in the art that various changes in form and details may be made without departing from the spirit and scope of this invention.

We claim:

1. A spin valve structure in a spintronic device, comprising:
   (a) a composite seed layer comprising at least a lower Ta layer formed on a substrate and a metal (M1) layer having a fcc(111) or hcp(001) crystal structure disposed on the lower Ta layer;
   (b) a (Co/Ni)$_x$ laminated reference layer where x is from about 5 to 70 and wherein a thickness (t2) of each Ni layer is greater than a thickness (t1) of each Co layer;
   (c) a magnetic layer having a high spin polarization and a small magnetic damping coefficient; and
   (d) a metallic spacer layer formed between the (Co/Ni)$_x$ laminated reference layer and the magnetic layer.

2. The spin valve structure of claim 1 further comprised of a capping layer and having a bottom spin valve configuration in which the composite seed layer, (Co/Ni)$_x$ laminated reference layer, a Cu spacer layer, a magnetic (free) layer, and capping layer are sequentially formed on said substrate.

3. The spin valve structure of claim 2 the Cu spacer has a thickness from about 15 to 150 Angstroms and the capping layer has a Ru/Ta/Ru configuration.

4. The spin valve structure of claim 2 wherein the Cu spacer is further comprised of a nano-oxide layer (NOL) formed between a lower portion of the Cu spacer and an upper portion of the Cu spacer, said NOL has current confining paths of Cu formed therein.

5. The spin valve structure of claim 1 further comprised of a capping layer and having a top spin valve configuration in which the composite seed layer, magnetic layer, a Cu spacer layer, (Co/Ni)$_x$ laminated reference layer, and capping layer are sequentially formed on said substrate.

6. The spin valve structure of claim 1 wherein the lower Ta layer has a thickness from about 5 to 100 Angstroms and the metal (M1) layer with fcc(111) or hcp(001) crystal orientation has a thickness between about 10 to 100 Angstroms.

7. The spin valve structure of claim 1 wherein the M1 layer is Ru, Cu, or Au and the composite seed layer has a Ta/M1 configuration.

8. The spin valve structure of claim 1 wherein the composite seed layer is further comprised of a metal layer M2 that is one of Cu, Ti, Pd, W. Rh, Au, or Ag and formed on the M1 layer to give a Ta/M1/M2 configuration in which the lower Ta layer thickness is from about 5 to 100 Angstroms, the M1 layer thickness is between about 10 and 100 Angstroms, the metal M2 layer thickness is from about 1 to 100 Angstroms, and M1 is unequal to M2.

9. The spin valve structure of claim 1 wherein the thickness t1 is from about 0.5 to 5 Angstroms and the thickness t2 is between about 2 and 10 Angstroms.

10. The spin valve structure of claim 1 wherein the magnetic layer is comprised of an FeCo alloy including at least one of Al, Ge, Si, Ga, B, C, Se, Sn, or is a Heusler alloy comprised of Co$_2$MnSi, Co$_2$FeSi, Co$_2$MnAl, Co$_2$FeAl, Co$_2$MnGe, Co$_2$FeGe, or is a half Heusler alloy comprised of CoMnSi, CoFeSi, CoMnAl, or CoFeGe.

11. A bottom spin valve structure in a spintronic device, comprising:
   (a) a composite seed layer comprising at least a lower Ta layer formed on a substrate and a metal (M1) layer having a fcc(111) or hcp(001) crystal structure disposed on the lower Ta layer;
   (b) a (Co/Ni)$_x$ laminated reference layer formed on the composite seed layer, and wherein x is from about 5 to 70 and wherein a thickness (t2) of each Ni layer is greater than a thickness (t1) of each Co layer;
   (c) a tunnel barrier layer formed on the (Co/Ni)$_x$ laminated reference layer;
   (d) a magnetic layer having a high spin polarization and a small magnetic damping coefficient formed on the tunnel barrier layer; and
   (e) a capping layer formed on the magnetic layer.

12. The bottom spin valve structure of claim 11 wherein the lower Ta layer has a thickness from about 5 to 100 Angstroms and the metal M1 layer is comprised of Ru, Cu, or Au with a thickness between about 10 to 100 Angstroms.

13. The bottom spin valve structure of claim 11 wherein the composite seed layer is further comprised of a metal M2 layer that is one of Cu, Ti, Pd, W. Rh, Au, or Ag and formed on the metal M1 layer to give a Ta/M1/M2 configuration in which the lower Ta layer thickness is from about 5 to 100 Angstroms, the M1 layer thickness is between about 10 and 100 Angstroms, the metal M2 layer thickness is from about 1 to 100 Angstroms, and M1 is unequal to M2.

14. The bottom spin valve structure of claim 11 wherein the thickness t1 is from about 0.5 to 5 Angstroms and the thickness t2 is between about 2 and 10 Angstroms.

15. The bottom spin valve structure of claim 11 wherein the magnetic layer is comprised of an FeCo alloy including at least one of Al, Ge, Si, Ga, B, C, Se, Sn, or is a Heusler alloy comprised of $Co_2MnSi$, $Co_2FeSi$, $Co_2MnAl$, $Co_2FeAl$, $Co_2MnGe$, $Co_2FeGe$, or is a half Heusler alloy comprised of CoMnSi, CoFeSi, CoMnAl, or CoFeGe.

16. The bottom spin valve structure of claim 11 wherein the capping layer has a Ru/Ta/Ru configuration and the tunnel barrier layer is comprised of AlOx, MgO, TiOx, TiAlOx, MgZnOx, ZnOx, or other metal oxides or metal nitrides typically employed as insulator layers.

17. A spintronic device for MAMR recording, comprising: a first electrode and a second electrode with a stack of layers formed between said first electrode and second electrode, including:
(a) a composite seed layer comprising at least a lower Ta layer contacting the first electrode and a metal M1 layer having a fcc(111) or hcp(001) crystal orientation disposed on the lower Ta layer opposite the first electrode;
(b) a $(Co/Ni)_x$ laminated layer that serves as a spin injection layer which is formed on the composite seed layer, and wherein x is from about 5 to 70 and wherein a thickness (t2) of each Ni layer is greater than a thickness (t1) of each Co layer;
(c) a metallic spacer formed between a field generation layer (oscillator layer) and the $(Co/Ni)_x$ laminated layer; and
(d) a magnetic layer that serves as an oscillator layer, and having a high spin polarization and a small magnetic damping coefficient formed on the metallic spacer.

18. The spintronic device of claim 17 wherein the lower Ta layer has a thickness from about 5 to 100 Angstroms and the metal M1 layer is comprised of Ru, Cu, or Au and has a thickness between about 10 to 100 Angstroms.

19. The spintronic device of claim 17 wherein the first electrode is a trailing shield in a write head and the second electrode is a main pole layer in said write head.

20. The spintronic device of claim 17 wherein the composite seed layer is further comprised of a metal M2 layer that is one of Cu, Ti, Pd, W. Rh, Au, or Ag and formed on the metal M1 layer to give a Ta/M1/M2 configuration in which the lower Ta layer thickness is about 5 to 100 Angstroms, the metal M1 layer thickness is between about 10 and 100 Angstroms, and metal M2 layer thickness is about 1 to 100 Angstroms.

21. The spintronic device of claim 17 wherein the thickness t1 is from about 0.5 to 5 Angstroms and the thickness t2 is between about 2 and 10 Angstroms.

22. The spintronic device of claim 17 further comprised of a layer having perpendicular magnetic anisotropy (PMA) formed on the field generation layer on a surface opposite the metallic spacer, said PMA layer contacts the second electrode.

23. A method of forming a spin valve structure in a spintronic device; comprising:
(a) depositing a composite seed layer having a fcc(111) crystalline lattice structure on a substrate, said composite seed layer comprises at least a lower Ta layer and a metal M1 layer having a fcc(111) or hcp(001) crystal orientation disposed on the lower Ta layer;
(b) forming a stack of layers on said composite seed layer, said stack of layers comprises:
(1) a $(Co/Ni)_x$ laminated reference layer where x is from about 5 to 70 and wherein a thickness (t2) of each Ni layer is greater than a thickness (t1) of each Co layer;
(2) a magnetic layer having a high spin polarization and a small magnetic damping coefficient, said magnetic layer has a magnetic moment along an easy axis direction that is switched to an opposite direction when a spin torque of sufficient magnitude is applied thereto; and
(3) a metallic spacer or tunnel barrier layer formed between said $(Co/Ni)_x$ laminated reference layer and said magnetic layer.

24. The method of claim 23 further comprised of annealing the spin valve structure at a temperature of about 200° C. to 280° C. for a period of 0.5 to 10 hours.

25. The method of claim 23 wherein the $(Co/Ni)_x$ laminated reference layer is deposited by a DC magnetron sputtering process comprising a RF power of less than about 200 Watts and an Ar flow rate of greater than about 15 standard cubic centimeters per minute.

26. The method of claim 23 wherein the lower Ta layer has a thickness from about 5 to 100 Angstroms and the metal M1 layer is comprised of Ru, Cu, or Au and has a thickness between about 10 to 100 Angstroms.

27. The method of claim 23 wherein the seed layer is further comprised of a metal M2 layer that is one of Cu, Ti, Pd, W. Rh, Au, or Ag and formed on the metal M1 layer to give a Ta/M1/M2 configuration in which the lower Ta layer thickness is from about 5 to 100 Angstroms, the metal M1 layer thickness is between about 10 and 100 Angstroms, and the metal M2 layer thickness is from about 1 to 100 Angstroms.

28. The method of claim 23 wherein the thickness t1 is from about 0.5 to 5 Angstroms and the thickness t2 is between about 2 and 10 Angstroms.

29. The method of claim 23 wherein the magnetic layer is comprised of a FeCo alloy including at least one of Al, Ge, Si, Ga, B, C, Se, Sn, or is a Heusler alloy comprised of $Co_2MnSi$, $Co_2FeSi$, $Co_2MnAl$, $Co_2FeAl$, $Co_2MnGe$, $Co_2FeGe$, or is a half Heusler alloy comprised of CoMnSi, CoFeSi, CoMnAl, or CoFeGe.

* * * * *